United States Patent
Sasaki et al.

(10) Patent No.: US 6,191,524 B1
(45) Date of Patent: Feb. 20, 2001

(54) PIEZOELECTRIC VIBRATORS

(75) Inventors: Yukinori Sasaki, Hyogo; Tetsuro Shimamura, Kyoto, both of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/328,390

(22) Filed: Jun. 9, 1999

(30) Foreign Application Priority Data

Jun. 9, 1998 (JP) .................................................. 10-160130

(51) Int. Cl.[7] .............................. H03B 5/32; H01L 41/04
(52) U.S. Cl. ............................................. 310/367; 310/371
(58) Field of Search .................................... 310/349, 368, 310/371

(56) References Cited

U.S. PATENT DOCUMENTS

| | | | |
|---|---|---|---|
| 4,135,108 | * 1/1979 | Besson ................................... | 310/349 |
| 4,334,168 | * 6/1982 | Besson et al. ......................... | 310/349 |
| 5,198,716 | * 3/1993 | Godshall et al. ..................... | 310/349 |
| 5,548,178 | * 8/1996 | Eda et al. .............................. | 310/349 |
| 5,689,220 | * 11/1997 | Kaida .................................... | 310/368 |
| 5,696,472 | * 12/1997 | Kaida .................................... | 310/368 |

FOREIGN PATENT DOCUMENTS

| | | | |
|---|---|---|---|
| 24 08 404 | * 2/1975 | (DE) | ................................... 310/321 |
| 2431189 | * 3/1980 | (FR) | ................................... 310/371 |
| 52-17784 | * 9/1977 | (JP) | ................................... 310/368 |
| 58-190115 | 11/1983 | (JP) | ................................ H03H/9/19 |
| 5-259799 | 10/1993 | (JP) | ................................ H03H/9/19 |

\* cited by examiner

*Primary Examiner*—Thomas M. Dougherty
(74) *Attorney, Agent, or Firm*—Wenderoth, Lind, & Ponack, L.L.P.

(57) ABSTRACT

A piezoelectric vibrator using thickness mode as the primary vibration and having a cross section of a bevel or convex configuration is provided which is superior in mechanical strength, easy to steadily mount, and has a small dispersion of characteristic. By employing a structure in which a vibrator 1 and a support section 2 are composed of the same material, the end portions of the vibrator section are integrated with the support section on the periphery of the vibrator, and the configuration of the cross section of the vibrator 1 is such that the thicknesses of the end portions of the vibrator are smaller than that of the central portion of the vibrator, a superior mechanical strength without chipping or cracking at the end portions of the vibrator is obtained allowing easy mounting while keeping the vibrator size small. The structure provides an added effect of a small dispersion of characteristic because the end portions of the vibrator are not exposed and the dispersion of the precision of working such as chipping and surface roughness at the end portions of the vibrator is small.

12 Claims, 9 Drawing Sheets

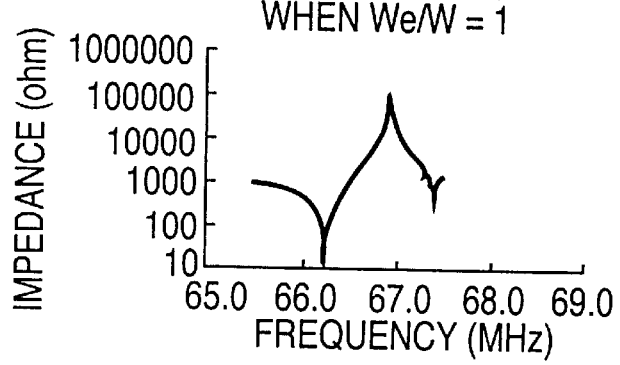
FIG. 8(a) WHEN We/W = 1
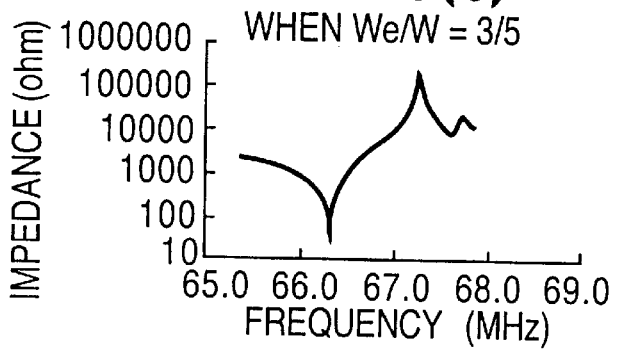
FIG. 8(b) WHEN We/W = 3/5
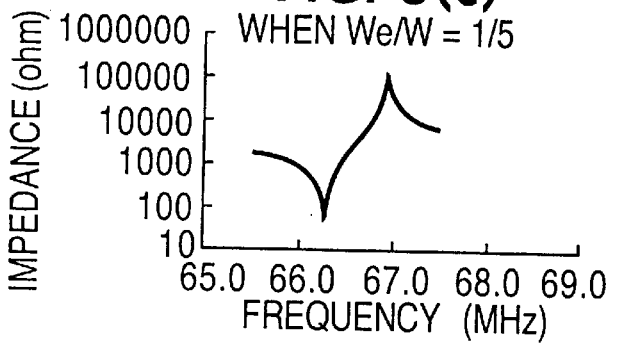
FIG. 8(c) WHEN We/W = 1/5
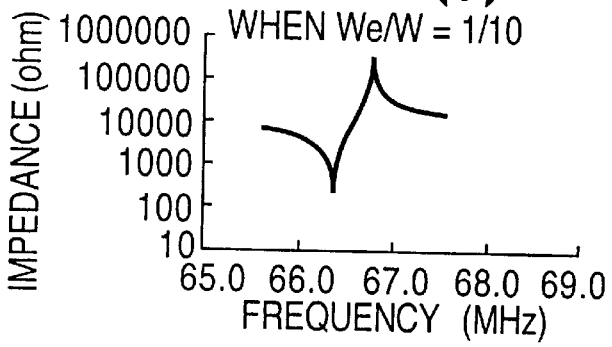
FIG. 8(d) WHEN We/W = 1/10

PIEZOELECTRIC VIBRATORS

BACKGROUND OF THE INVENTION

1. Field of the Invention

The present invention relates to a piezoelectric vibrator having a bevel or convex configuration and using thickness-mode vibration as the primary vibration.

2. Description of the Prior Art

Piezoelectric vibrators have been in use as the sources of clock in various types of electronic equipment, many of them in small size, or rectangular types especially in the case of piezoelectric vibrators for surface mounting. For vibrators to be used in the sources of clock, a stable temperature characteristic and a high mechanical quality factor Q are required to avoid an abrupt change of the vibration frequency due to the coupling at a certain temperature of the primary vibration (typically thickness mode such as thickness-sliding vibration and thickness longitudinal vibration) and spurious vibration.

With piezoelectric vibrators in which the primary vibration is thickness-sliding vibration such as using AT-cut crystal plate or X-plate of lithium tantalate or in which the primary vibration is thickness longitudinal vibration such as using Z-plate of lithium niobate, for example, the spurious vibration can be suppressed by locally forming a vibration-excitation electrode on the primary plane of the vibrator. This makes use of the phenomenon of vibration energy being confined only underneath the vibration-excitation electrode when a specific vibration mode of a specific piezoelectric material is used as the primary vibration by locally forming the vibration-excitation electrode on the primary plane of the vibrator. Such a vibrator is called an energy-confining type vibrator.

This phenomenon is described in the following by referring to FIG. 3 which is a cross-sectional view of a piezoelectric vibrator. Assuming in FIG. 3 that the cut-off frequency of the portion where a vibration-excitation electrode 6 is formed is f0 and that of the non-electrode portion is f0', at a frequency higher than f0' the vibration energy is freely propagated without making a standing wave even underneath the vibration-excitation electrode. However, in the range of frequency higher than f0 and lower than f0', though vibration energy freely propagates on the portion the vibration-excitation electrode 6 is formed, it exponentially attenuates on the non-electrode portion and the vibration displacement declines as one goes closer to the end portions of the vibrator. Unless the amount of attenuation of the vibration energy on the non-electrode portion is large enough, or unless the magnitude of vibration displacement at the end portions of the vibrator is small enough, spurious vibration is produced by the waves reflected at the end portions of the vibrator thus deteriorating the characteristic.

Consequently, in consideration of the requirement to provide a non-electrode portion having certain minimum dimensions in order to suppress such spurious vibration and to obtain a high mechanical quality factor Q and the fact that the dimensions of the vibration-excitation electrode are determined by several conditions including securing of a low resonant impedance, it is self-evident that a certain minimum vibrator length is required. For example, in the case of a thickness-sliding vibrator using an X-plate of lithium tantalate, the ratio L/H of the longitudinal length L of the vibrator to the thickness H of the vibrator is required to be 14 or greater (ref. Japanese Laid-Open Patent Application No. Sho 58-190115).

Among the methods to increase the degree of attenuation of the vibration displacement at the end portions of a vibrator, a method to form the end portions of the vibrator to a bevel or convex configuration is well known. However, by making the end portions of the vibrator to a bevel or convex configuration, the thicknesses of the end portions of the vibrator become small causing a problem in the mechanical strength and leading to chipping or cracking. Furthermore, when it comes to mounting on a board by the conventional method of securing a piezoelectric vibrator by electrically conductive adhesive and the like, it becomes harder to steadily mount a piezoelectric vibrator on a board because of the added problem of dispersion of electrical characteristic such as the resonant frequency and resonant impedance due to dispersion of coating condition of the electrically conducting adhesive and the like especially for smaller-size piezoelectric vibrators.

As a result, as a method to address these problems, a piezoelectric vibrator is proposed in which a vibrator section and a support section are integrated. For instance, in a thickness-sliding vibrator using an AT-cut crystal plate, a slit is provided by sand blasting process on the end portions in the direction perpendicular to the longitudinal direction of the vibrator which is the direction of propagation of the primary vibration, or the direction of width of the vibrator, to allow integration of only the longitudinal end portions with the support section (ref. Japanese Laid-Open Patent Application No. Hei 5-259799).

As it was necessary to make the length of the non-electrode portion large in order to sufficiently confine vibration energy and to make the vibration displacement at the end portions of the vibrator small enough, there has been limitation in making the size of the vibrator small while securing sufficient amount of attenuation of the vibration displacement at the end portions of the vibrator.

Also, while the size of the vibrator could be made smaller by making the vibrator cross section bevel or convex in configuration as the amount of attenuation of the vibration displacement at the end portions of the vibrator becomes larger than that of a vibrator having a rectangular cross section, the vibrator suffered a problem of having a poor mechanical strength such as chipping or cracking of the end portions of the vibrator due to a small thickness of the end portions of the vibrator, thus making steady mounting difficult.

Furthermore, in the method of integrating the vibrator section and the support section at the end portions in the longitudinal direction of the vibrator and providing a slit on the end portions of the vibrator in the direction of width, there has been a problem of dispersion of the characteristic depending on the precision of working including chipping and surface roughness at the end portions in the direction of width of the vibrator.

FIG. 14 is a disassembled perspective view of an example of a conventional vibrator comprising a vibrator 29, a vibration-excitation electrode 30, a lead 31 for connection with an external-connection electrode 32, and a mounting board 33.

SUMMARY OF THE INVENTION

It is an object of the present invention to provide a piezoelectric vibrator which is free from chipping or cracking at the end portions of the vibrator, superior in mechanical strength, easy to steadily mount, and which does not have a slit or other exposed portion at the end portions of the vibrator section, and has a small dispersion of characteristic attributable to the precision of working at the end portions of the vibrator section.

To accomplish this object, the piezoelectric vibrator of the present invention comprises a vibrator section and a support section that are composed of the same material, of which the end portions of the vibrator section are integrated with the support section on the periphery of the vibrator, and the cross section of the vibrator section is bevel or convex in configuration. Employment of the above structure makes steady mounting easy with a superior mechanical strength without any chipping or cracking at the end portions of the vibrator section where the thickness is smaller than the central portion of the vibrator while keeping the vibrator size small. It has an added effect of reducing dispersion of characteristic attributable to the precision of working at the end portions of the vibrator section.

Preferably, the above vibrator uses thickness-sliding vibration as the primary vibration, the vibrator section and the vibration-excitation electrode having a rectangular configuration with the ratio We/W between the width W of the vibrator section and the width We of the vibration-excitation electrode being in the range ⅕ to 1. This configuration is effective in making the amount of attenuation of the vibration displacement at the end portions in the direction of width of the vibrator section larger while securing a low resonant impedance.

Preferably, the above vibrator uses thickness longitudinal vibration as the primary vibration, the vibration-excitation electrode having a circular configuration with the ratio $\phi e/\phi$ between the minimum external dimension $\phi$ of the vibrator section and the diameter $\phi e$ of the vibration-excitation electrode being in the range ⅕ to 1. This configuration is effective in making the amount of attenuation of the vibration displacement at the end portions of the vibrator section larger while securing a low resonant impedance.

Preferably, configuration of the cross section of the border between the vibrator section and the support section, the border being the portion from where a lead is taken out from the vibration-excitation electrode to outside, is chosen to be an inclined plane or a curved surface. This configuration is effective in suppressing a break of the lead on the border between the vibrator section and the support section.

Preferably, the vibrator is such that the vibrator section is stepwise in configuration approximating a convex configuration in place of a bevel or convex configuration of the cross section of the vibrator section.

Preferably, the vibrator is such that the cross section of the vibrator section is stepwise in configuration of which the configuration of the steps is an inclined plane or a curved surface. This configuration is effective in suppressing a break of the vibration-excitation electrode at the riser portion of the steps.

Preferably, the vibrator is such that the cross section of the vibrator section of the vibrator is stepwise in configuration of which the number of steps is in the range 2 to 10 from the end portions of the vibrator toward the central portion of the vibrator.

BRIEF DESCRIPTION OF THE DRAWINGS

FIG. 4($b$) is a cross-sectional view of the vibrator when its cross section in the longitudinal direction is rectangular.

FIG. 5($b$) is a cross-sectional view of the vibrator when its cross section in the longitudinal direction is planoconvex in configuration.

FIG. 6($b$) is a cross-sectional view of the vibrator when its cross section in the direction of width is rectangular.

FIG. 7($b$) is a cross-sectional view of the vibrator when its cross section in the direction of width is planoconvex in configuration.

FIGS. 8($a$)–8($d$) show impedance vs. frequency characteristic for various ratios between the vibrator width and the width of the vibration-excitation electrode.

DESCRIPTION OF THE PREFERRED EMBODIMENTS

Exemplary Embodiments

Figure 1:
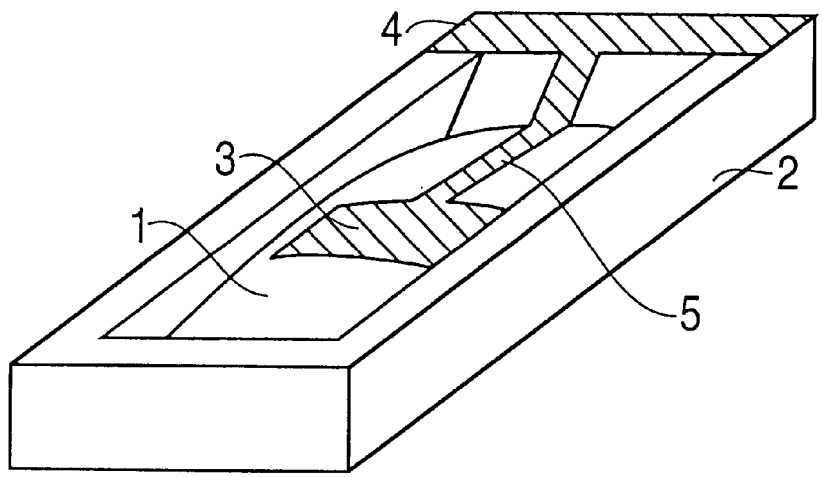
FIG. 1 is a perspective view of an exemplary embodiment of the vibrator of the present invention.

The invention described in claim 1 of the present invention is a piezoelectric vibrator comprising a vibrator section and a support section that are composed of the same material, the end portions of the vibrator section of which are integrated with the support section on the periphery of the vibrator, and the cross section of the vibrator section is bevel or convex in configuration. It provides a function of making steady mounting easy with a superior mechanical strength without any chipping or cracking at the end portions of the vibrator section while making the vibrator size small. It has an added effect of reducing dispersion of characteristic attributable to the precision of working at the end portions of the vibrator section.

The invention described in claim 2 is the piezoelectric vibrator of claim 1 in which thickness-sliding vibration is used as the primary vibration, configuration of the vibrator section and the vibration-excitation electrode is rectangular and the ratio W/We between the width W of the vibrator section and the width We of the vibration-electrode is in the range ⅕ to 1. It has a function equivalent to that of claim 1.

The invention described in claim 3 is the piezoelectric vibrator of claim 1 in which thickness longitudinal vibration is used as the primary vibration, the configuration of the vibration-excitation electrode is circular, and the ratio $\phi e/\phi$ between the minimum external dimension $\phi$ of the vibrator section and the diameter $\phi e$ of the vibration-excitation electrode is in the range ⅕ to 1. It has a function equivalent to that of claim 1.

The invention described in claim 4 is the piezoelectric vibrator of claim 1 of which the configuration of the cross section of the border between the vibrator section and the support section is an inclined plane or a curved surface, the border being the portion from where a lead is taken out to outside. It has a function of suppressing a break at the border between the vibrator section and the support section of the lead connecting to an external connection electrode.

The invention described in claim 5 is the vibrator of claim 1 of which the cross section of the vibrator section is stepwise in configuration approximating a convex configuration in place of the bevel or convex configuration of the cross section of the vibrator section. It has a function equivalent to that of claim 1.

The invention described in claim 6 is the piezoelectric vibrator of claim 5 of which the cross section of the vibrator section is stepwise in configuration and the configuration of the cross section of the steps is an inclined plane or a curved surface. It has a function of suppressing a break of the vibration-excitation electrode at the riser portion of the steps.

The invention described in claim 7 is the piezoelectric vibrator of claim 5 of which the cross section of the vibrator section is stepwise in configuration and the number of the steps is between 2 and 10 from the end portions of the vibrator toward the central portion of the vibrator. It has a function equivalent to that of claim 1.

Figure 2:
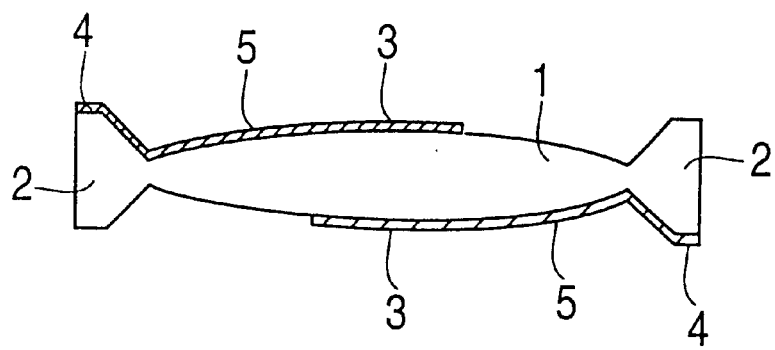
FIG. 2 is a cross-sectional view of the vibrator.
Figure 3:
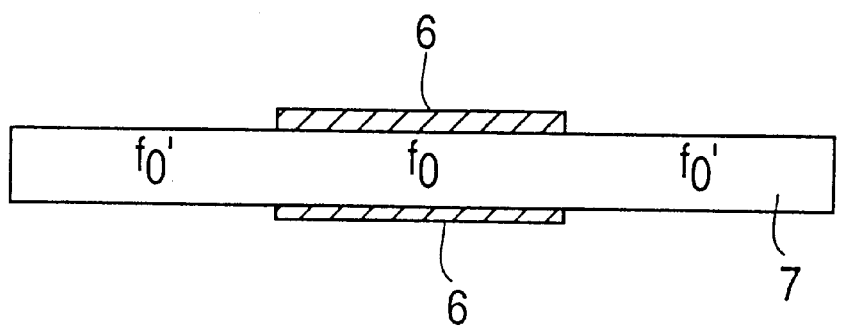
FIG. 3 is a cross-sectional view illustrating an energy-confining type vibrator.

Referring now to FIGS. 1, 2, and 4 through 9, a description of an exemplary embodiment of the present invention will be given in the following. In FIG. 1 and FIG. 2, numeral 1 is a piezoelectric vibrator, numeral 2 is a support section integrated with the vibrator 1, numeral 3 are vibration-excitation electrodes opposingly provided on the front and rear sides of the vibrator 1, numeral 4 is an electrode for external connection, and numeral 5 is a lead connectiong to the external connection electrode.

As an example, a vibrator using an X-plate of lithium tantalate single crystal of which the primary vibration is thickness-sliding vibration will be discussed. Assuming that the resonant frequency of the vibrator is 20 MHz, the thickness H of the vibrator is calculated to be 100 $\mu$m. In a prior art design example where the L/H ratio is set to be 14 or greater, if we assume L/H=14 the longitudinal length L of the vibrator is calculated to be approximately 1.4 mm when H is approximately 100 $\mu$m. In calculating the degree of attenuation of the vibration displacement under this setting, it is to be noted that the degree of attenuation of vibration displacement due to energy confinement depends not only on the dimensions of the vibration-excitation electrode but also on the mass of the vibration-excitation electrode, and the larger the mass of the vibration-excitation electrode the greater the attenuation of the vibration displacement. However, when the mass of the vibration-excitation electrode is too large, it produces a loss component that impedes thickness-sliding vibration thereby presenting one of the factors for increasing vibrator impedance. Consequently, it is generally practiced to put several hundred to several thousand angstroms of silver or gold on the primary plane of the vibrator as the vibration-excitation electrode. Here, a vibration-excitation electrode 0.6 mm in length and 5000 angstroms in thickness, for example, will now be formed at the center of the longitudinal direction of the vibrator on each side of the X-plane, being the primary plane, of the vibrator using gold as the material of the vibration-excitation electrode.

Figure 4A:
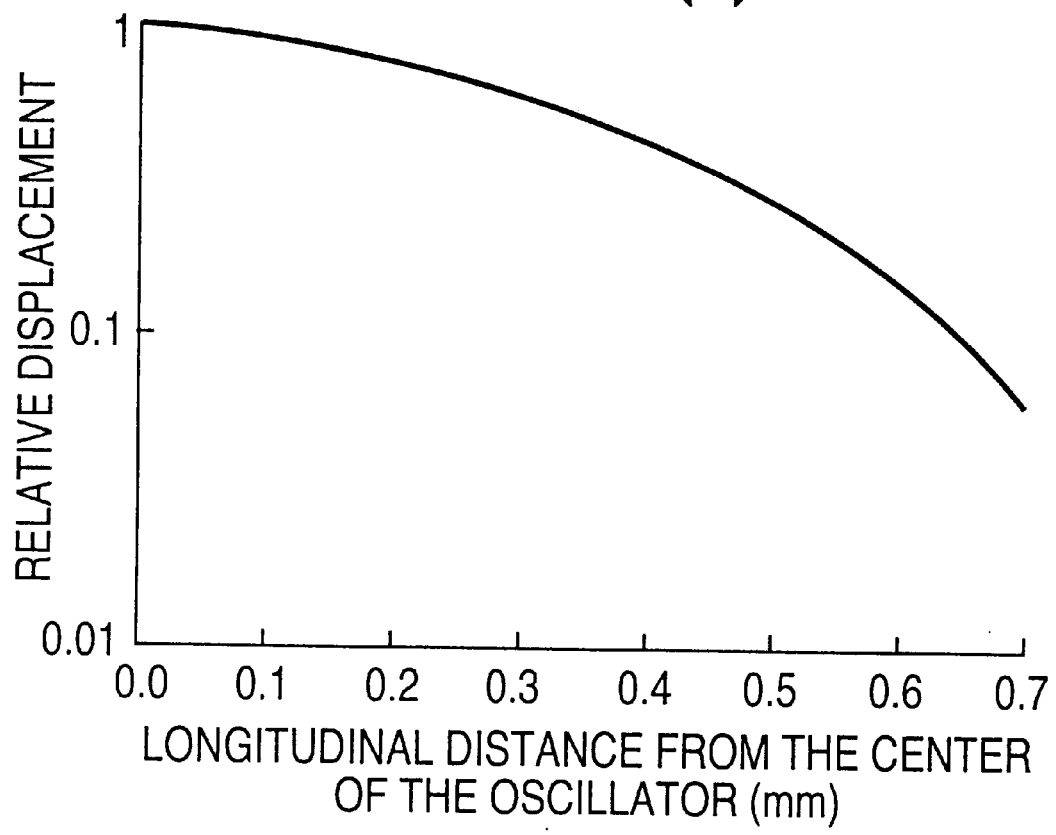
FIG. 4($a$) is a diagram showing distribution of the relative displacement in the longitudinal direction of a vibrator.
Figure 4B:
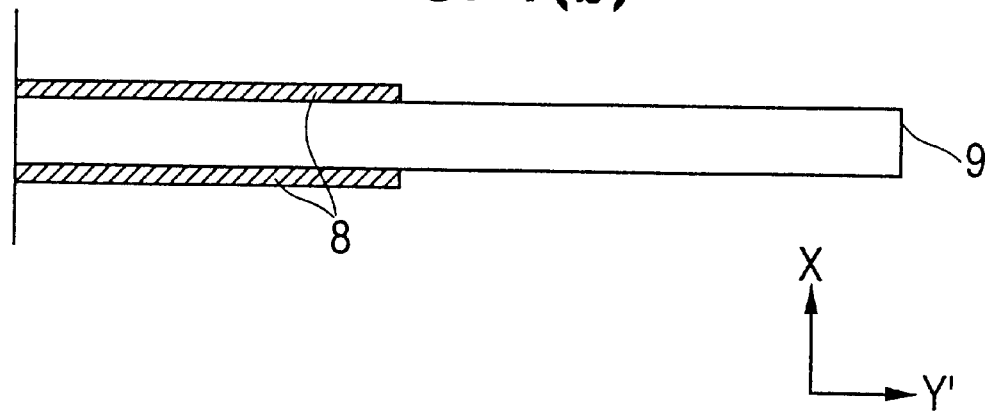

Calculated results of the degree of attenuation of the vibration displacement when the vibrator cross section in the longitudinal direction is rectangular are shown in FIG. 4. In FIG. 4, the X-direction is vertical to the primary plane of the vibrator, the Y'-direction is the longitudinal direction of the vibrator which is the direction of propagation of thickness-sliding vibration and is the direction approximately 50 degrees clockwise around the X-axis from the Y-axis of lithium tantalate crystal. In the graph of FIG. 4, the abscissa represents the longitudinal distance in mm units from the center of the vibrator 9, and the ordinate represents in logarithmic scale relative displacement with the vibration displacement at the center of the vibrator 9 set to be 1. Hereafter, such graph is called relative displacement distribution in the longitudinal direction of the vibrator. In an energy-confining type vibrator, the vibration displacement reaches at a maximum at the center of the vibrator as shown in FIG. 4, then the vibration displacement becomes smaller as one goes closer to the end portions of the longitudinal direction, the magnitude of the relative displacement at the end portions in the longitudinal direction, namely at 0.7 mm on the abscissa, being approximately 6/100.

As the vibration displacement at the end portions of the longitudinal direction is small enough compared with that at the center of the vibrator as has been discussed, the effect due to reflected waves and the like at the end portions of the longitudinal direction is small and the spurious vibration can be suppressed.

Next, relative displacement distribution of a vibrator of which the configuration of the cross section in the longitudinal direction of the vibrator is convex rather than rectangular will be calculated. It is to be noted, however, that when the thickness of the convex-shaped central portion of the vibrator is chosen to be the same value of 100 $\mu$m as that of a vibrator with a rectangular cross section in the longitudinal direction, and the vibrator thickness is made to gradually decrease as one goes closer to the end portions in the longitudinal direction, the resonant frequency of the vibrator becomes slightly larger than the resonant frequency of the case when the cross section in the longitudinal direction of the vibrator is rectangular and the vibrator thickness is 100 $\mu$m. Therefore, calculation will be made by slightly increasing the thickness of the convex-shaped central portion of the vibrator from 100 $\mu$m so that the resonant frequency will approximately agree with that of a vibrator with a rectangular longitudinal cross section.

Figure 5A:
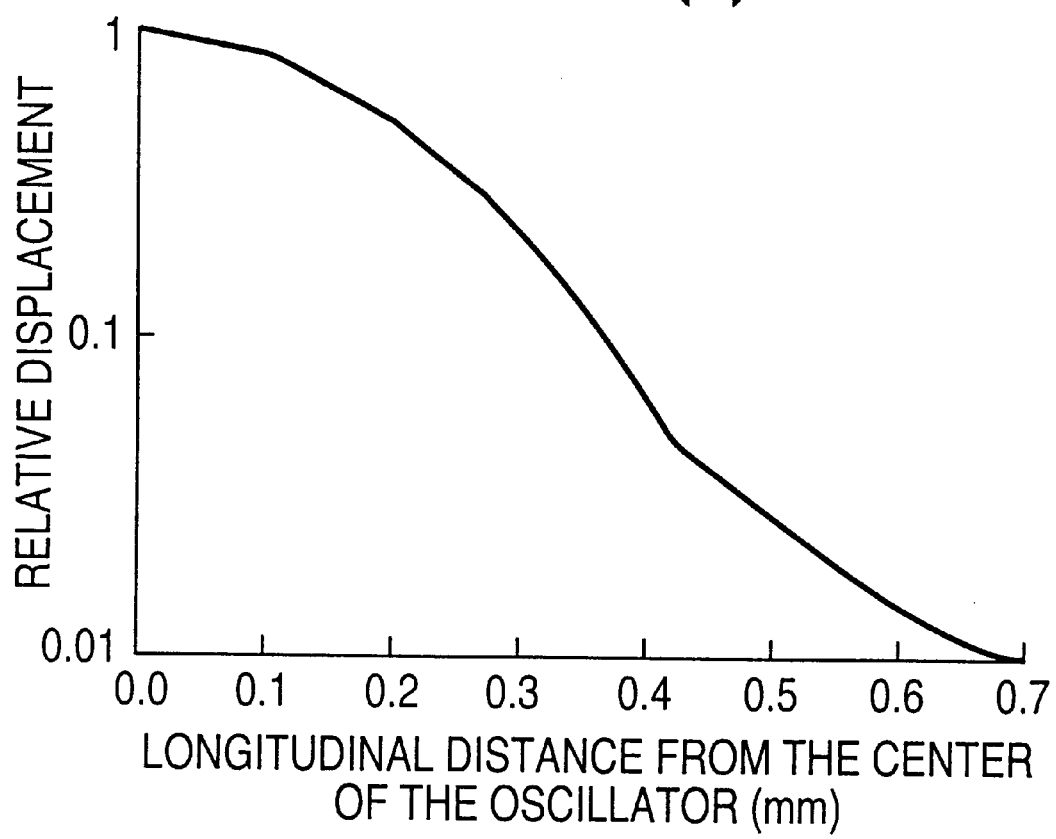
FIG. 5($a$) is a diagram showing distribution of the relative displacement in the longitudinal direction of a vibrator.
Figure 5B:
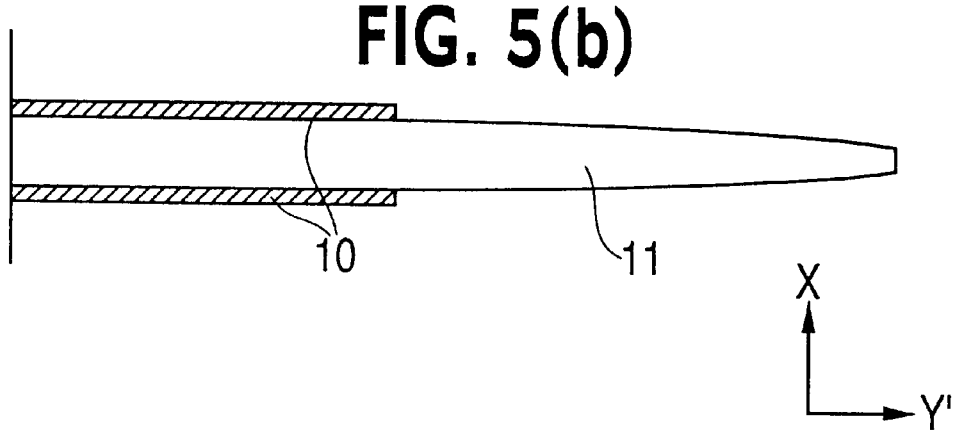

FIG. 5 shows results of calculation of the relative displacement distribution in the longitudinal direction of a vibrator 11 when the longitudinal cross section of the vibrator is convex in configuration rather than rectangular. Each of the X-direction and Y'-direction in FIG. 5 is the same as in FIG. 4. Similarly to the case of a vibrator with a rectangular longitudinal cross section, though the vibration displacement decreases as one goes closer to the end portions in the longitudinal direction, the magnitude of the relative displacement at the end portions in the longitudinal direction, namely at 0.7 mm on the abscissa, is smaller than that of a vibrator with a rectangular longitudinal cross section and is approximately 1/100. This indicates that the effect of energy confinement has been enhanced by employing a convex configuration as the longitudinal cross section of the vibrator.

Looking at only the vicinity of the central portion of the vibrator, as the thickness around there is roughly equal, the absolute value of the vibration displacement at the central portion is considered to be nearly equal whether the longitudinal cross section is rectangular or convex in configuration. Therefore, if the relative displacement is of the same value at the end portions in the longitudinal direction whether the longitudinal cross section is rectangular or convex in configuration, the suppression effect of spurious vibration attributable to the influence of reflected waves at the end portions in the longitudinal direction is either of the same degree or even larger as the reflected waves at the vibrator section is very small because it is integrated with the support section made of the same material rather than being mounted on a board with electrically conducting adhesive and the like at the end portions in the longitudinal direction.

Consequently, as the longitudinal distance from the center of the vibrator when the relative displacement at the end portions in the longitudinal direction for a convex longitudinal cross section is equal to approximately 6/100 that of the case of a rectangular longitudinal cross section is read to be approximately 0.41 mm from FIG. 5, it suffices that the longitudinal distance of the vibrator be approximately 0.82 mm when symmetry in the longitudinal direction is taken into account. Even when the length of the support section in the longitudinal direction of the vibrator is assumed to be 0.2 mm at each end of the longitudinal direction of the vibrator section, the total length of the vibrator section and the support section becomes 1.22 mm, which is smaller than the prior art design of 1.4 mm. Furthermore, as the end portions of the vibrator which have smaller thicknesses than the central portion of the vibrator are integrated with the support section, chipping and cracking are prevented contributing to the improvement of mechanical strength, thus handling of the vibrator becomes easy allowing easy mounting.

Next, with regard to the direction of width of the vibrator, in order to prevent spurious vibration such as width-sliding vibration and thickness-torsion vibration attributable to the dimensions of width of the vibrator, consideration has to be made on the vibrator configuration such as to make it a thin stick-like strip or to select a proper W/H ratio between the vibrator thickness H and the vibrator length W in the direction of width. However, when the resonant frequency goes higher calling for a smaller thickness of the vibrator, it becomes difficult to finish the end portions in the direction of width of the vibrator with a high precision.

As an example, a vibrator that uses the previously mentioned X-plate of lithium tantalate single crystal and thickness-sliding vibration as the primary vibration will be considered. The vibrator thickness and designed values of the vibration-excitation electrode are assumed to be the same as previously mentioned; namely, a vibrator with a thickness of 100 $\mu$m with a gold vibration-excitation electrode having a thickness of 5000 angstroms formed on each of the front and rear surfaces for a length of 0.4 mm in the direction of width of the vibrator and over the entire width of the vibrator.

Figure 6A:
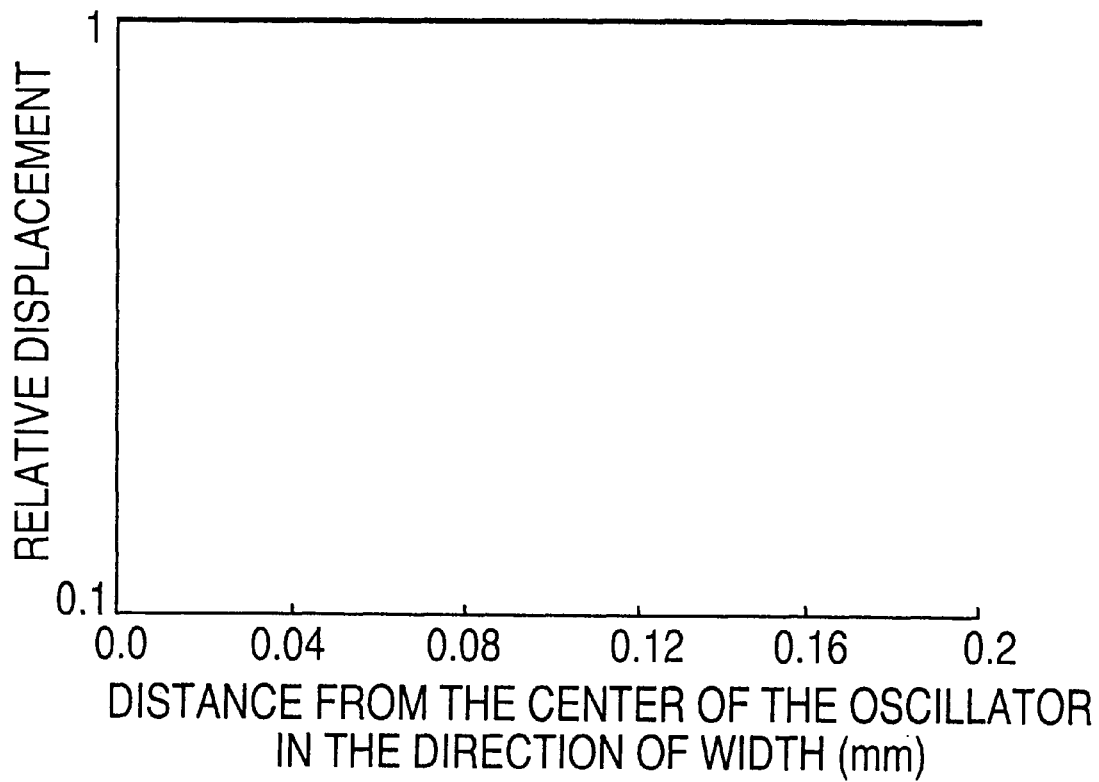
FIG. 6($a$) is a diagram showing distribution of the relative displacement in the direction of width of a vibrator.
Figure 6B:
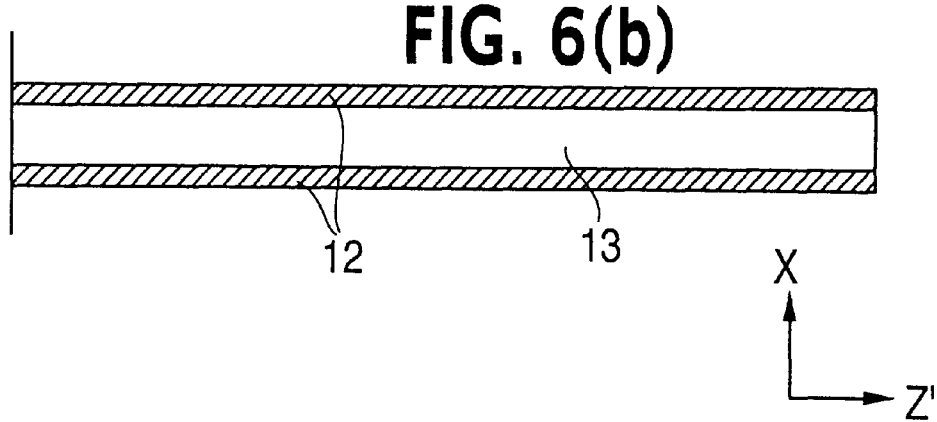

The distribution of the relative displacement in the direction of width of a vibrator with a rectangular cross section in the direction of width is shown in FIG. 6. In FIG. 6, the Z'-direction is a direction perpendicular on the primary plane to the direction of propagation of thickness-sliding vibration which is the primary vibration, and is the direction 90 degrees clockwise around the X-axis from the Y'-direction in FIG. 4. As can be seen from FIG. 6, as there is essentially no attenuation of the vibration displacement at the end portions in the direction of width of the vibrator when the cross section of the vibrator 13 in the direction of width is rectangular, poor degree of precision including chipping and surface roughness at the end portions in the direction of width will result in spurious vibration; in addition, as chipping and the like will scarcely occur constantly and steadily at the same place, it is extremely difficult to steadily prevent spurious vibration.

Figure 7A:
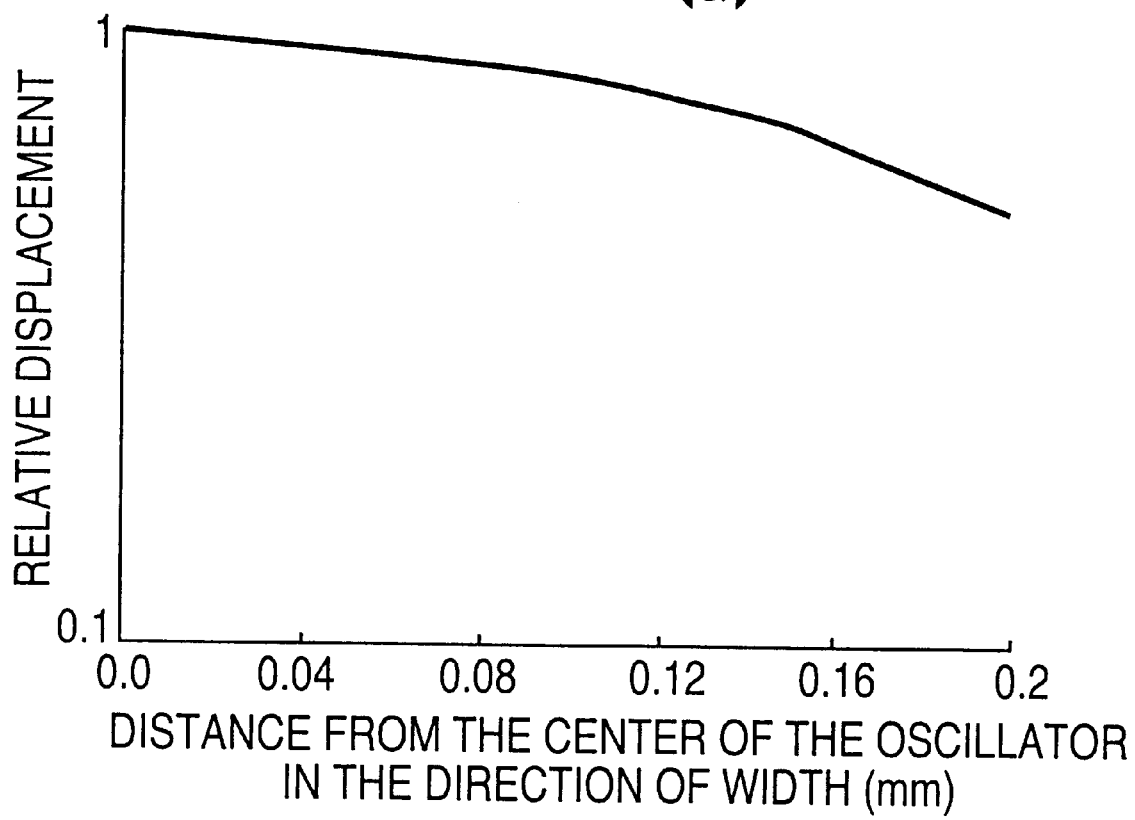
FIG. 7($a$) is a diagram showing distribution of the relative displacement in the direction of width of a vibrator.
Figure 7B:
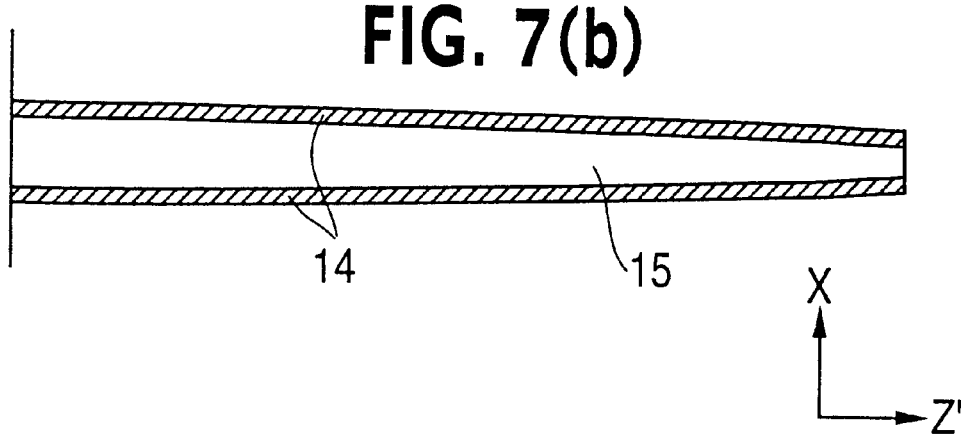

On the other hand, FIG. 7 shows distribution of the relative displacement in the direction of width of the vibrator when the configuration of the cross section of the vibrator in the direction of width is convex. Each of the X-direction and the Z'-direction in FIG. 7 is the same as in FIG. 6. The magnitude of the relative displacement at the end portions in the direction of width of the vibrator is approximately 5/10, which has been attenuated relative to the vibration displacement at the central portion of the vibrator, suggesting that spurious vibration due to poor degree of precision such as chipping and surface roughness at the end portions in the direction of width of the vibrator is unlikely to occur.

What is described above indicates that the degree of precision of working at the end portions of the vibrator little affects the vibrator characteristic and that there is less dispersion of characteristic. Furthermore, as the vibrator section is integrated with the support section at the end portions in the direction of width where vibration displacement is attenuated as in the case of making the cross section in the longitudinal direction of the vibrator convex in configuration, no chipping or cracking at the end portions in the direction of width of the vibrator occurs despite smaller thickness than the central portion of the vibrator thus providing a superior mechanical strength.

Also, regarding the direction of width, by locally providing a vibration-excitation electrode rather than over the entire direction of width, more of the vibration energy is confined around the central portion of the vibrator and the amount of attenuation of the vibration displacement at the end portions in the direction of width of the vibrator becomes large. However, when the length We in the direction of width of the vibration-excitation electrode is too small, it becomes difficult to efficiently collect charges from among the primary vibration charges distributed in the direction of width of the vibrator, resulting in an increase in the resonant impedance and a decrease in the mechanical quality factor Q.

FIG. 8 shows the frequency characteristic of impedance for various values of the width We of the vibration-excitation electrode when the length W of the vibrator in the direction of width is kept constant, namely, for the ratio We/W between the length W in the direction of width of the vibrator and the width We of the vibration-excitation electrode of 1, 3/5, 1/5, and 1/10. It can be seen from FIG. 8 that when We/W is smaller than 1/5, the resonant impedance is large and the acuity of resonance is not good. As a result of an effort in pursuit of an optimum ratio We/W between the length W of the vibrator in the direction of width and the vibration-excitation electrode width We by finely changing the ratio We/W, a characteristic with a resonant impedance of 100 ohms or below was steadily obtained when We/W was between 1/5 and 1.

Same thing was applicable to the ratio $\phi e/\phi$ between the minimum external dimension $\phi$ of a vibrator based on the primary vibration of thickness longitudinal vibration and the diameter $\phi e$ of a circular vibration-excitation electrode. Experimentally, a characteristic with a resonant impedance of 100 ohms or below was steadily obtained when the ratio $\phi e/\phi$ between the minimum external dimension $\phi$ of the vibrator and the diameter $\phi e$ of the circular vibration-excitation electrode was between 1/5 and 1.

As has been described above, by using the same material for the vibrator section and the support section, integrating the end portions of the vibrator section with the support section in the vicinity of the vibrator, and making the cross section of the vibrator section bevel or convex in configuration, a vibrator can be obtained which is superior in mechanical strength being free from chipping or cracking at the end portions of the vibrator section, easy of mounting including handling of the vibrator, and with a small dispersion of characteristic. Incidentally, when the cross section of the border between the vibrator section and the support section, from where a lead from the vibration-excitation electrode is taken out, is an inclined plane or a curved surface rather than a vertical plane, it provides an effect of making a break of the lead from the vibration-excitation electrode unlikely to occur at the border.

In the above described exemplary embodiment, the cross section configuration of the vicinity of the central portion of the vibrator was bevel or convex in which the thickness continuously decreases from that of the central portion of the vibrator toward the end portions of the vibrator. Similar effect may be obtained by approximating a convex configuration of the vibrator cross section with a stepwise configuration.

Figure 9A:
FIGS. 9($a$)–9($c$) show cross sections of a vibrator having a convex configuration and vibrators in which convex configuration has been approximated by a stepwise configuration.
Figure 9B:
Figure 9C:
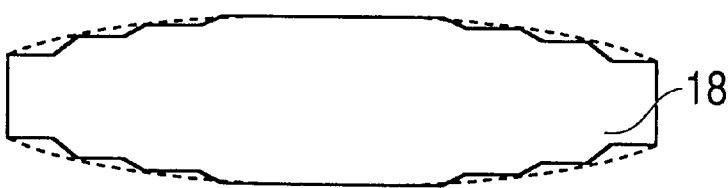

In other words, in FIG. 9, a vibrator (a) of which the cross section is convex in configuration can be approximatingly replaced by making the vibrator cross section stepwise in configuration as shown by (b). Furthermore, when the configuration of the cross section of the steps is inclined like (c), the degree of approximation is enhanced and a break of the vibration-excitation electrode at the riser portion of the steps is made unlikely to occur. The stepwise configurations of FIGS. 9(b) and (c) can be produced by a chemical process such as etching by changing step-by-step the dimension of the resist to protect the vibrator section or by a mechanical process such as sand blasting. By increasing the number of steps the degree of approximation of the continuous change of vibrator thickness from the central portion of the vibrator toward the end portions of the vibrator as shown by (a) can be enhanced. However, when the number of steps is excessively increased, the number of the above-mentioned etching or sand blasting process increases making the manufacturing process long and the manufacturing cost too high. In other words, a vibrator with the number of steps from the end portions of the vibrator toward the central portion of the vibrator being greater than 10 is not economical from the standpoint of the manufacturing cost.

EXAMPLES

Referring to FIGS. 10 to 13, examples of the present invention will be described.

Example 1

Figure 10:
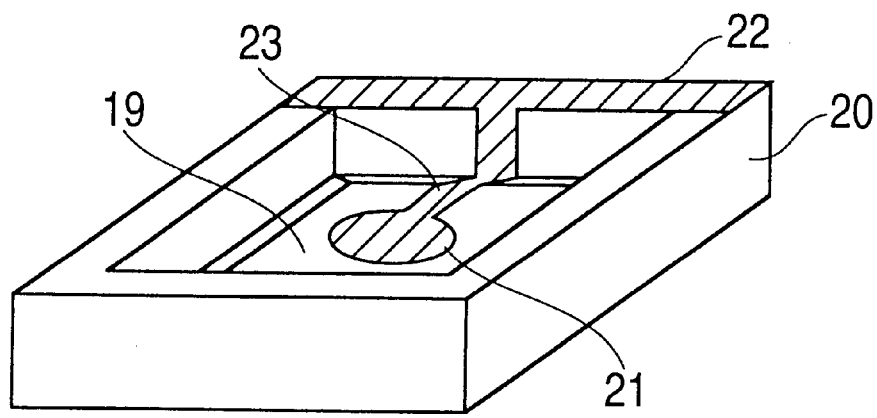
FIG. 10 is a perspective view of an exemplary embodiment of a vibrator of the present invention.
Figure 11:
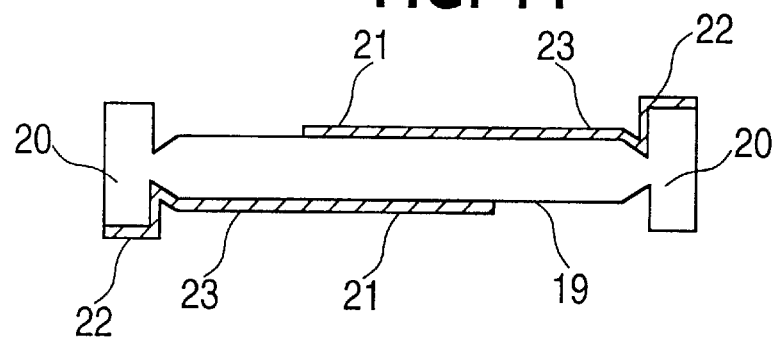
FIG. 11 is a cross-sectional view of the vibrator.

FIG. 10 and FIG. 11 illustrate a piezoelectric vibrator which uses thickness longitudinal vibration of lithium niobate Z-plate as the primary vibration, where numeral 19 is a vibrator processed to a bevel configuration, numeral 20 is a support section integrated with the vibrator 19, numeral 21 is a circular vibration-excitation electrode opposingly provided on the front and rear sides of the vibrator 19, numeral 22 is an electrode for external connection, and numeral 23 is a lead connecting to the external connection electrode. As the vibration-excitation electrode 21 is locally formed on the vibrator section, the vibration energy is confined underneath the vibration-excitation electrode and the vibration displacement is at a maximum at the central portion of the vibrator section attenuating as one goes closer to the end portions of the vibrator section. Furthermore, as the end portions of the vibrator section are bevel in configuration, the amount of attenuation of the vibration displacement at the end portions of the vibrator section is large. In addition, as the end portions of the vibrator section are integrated with the support section, there is less possibility of dispersion of precision of working including chipping or surface roughness at the end portions of the vibrator section.

Consequently, a vibrator with a small dispersion of characteristic can be obtained. Also, though the thicknesses of the end portions of the vibrator section are smaller than that of the central portion of the vibrator section by being formed into a bevel configuration, there occurs no chipping or cracking at the end portions of the vibrator section as they are integrated with the support section, thus providing a superior mechanical strength and easy mounting.

Example 2

Figure 12:
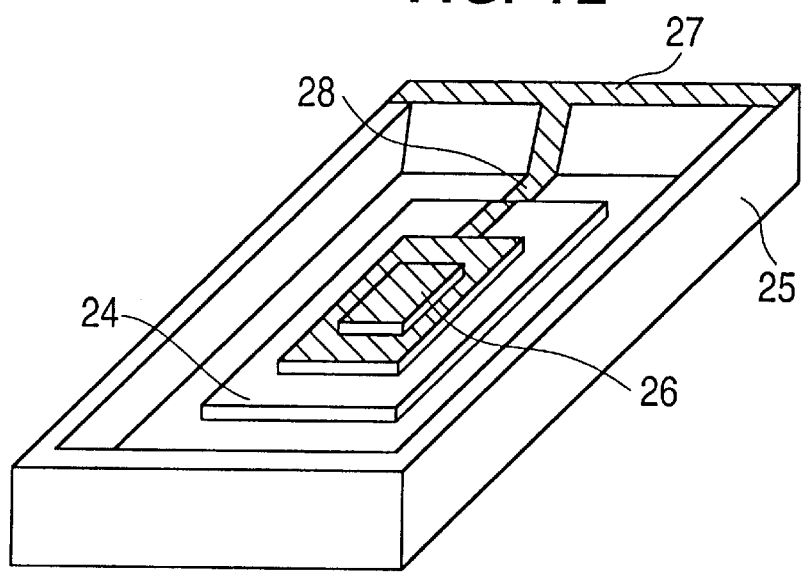
FIG. 12 is a perspective view of an exemplary embodiment of a vibrator of the present invention.
Figure 13:
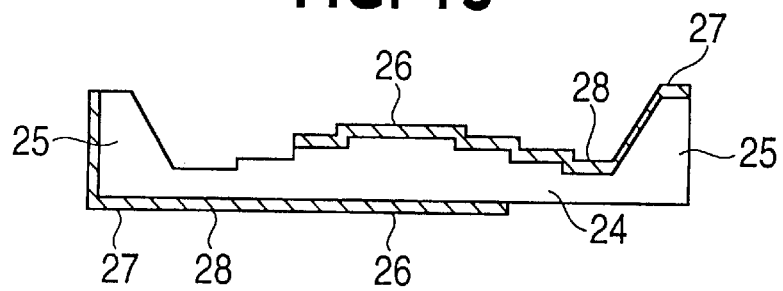
FIG. 13 is a cross-sectional view of the vibrator.
Figure 14:
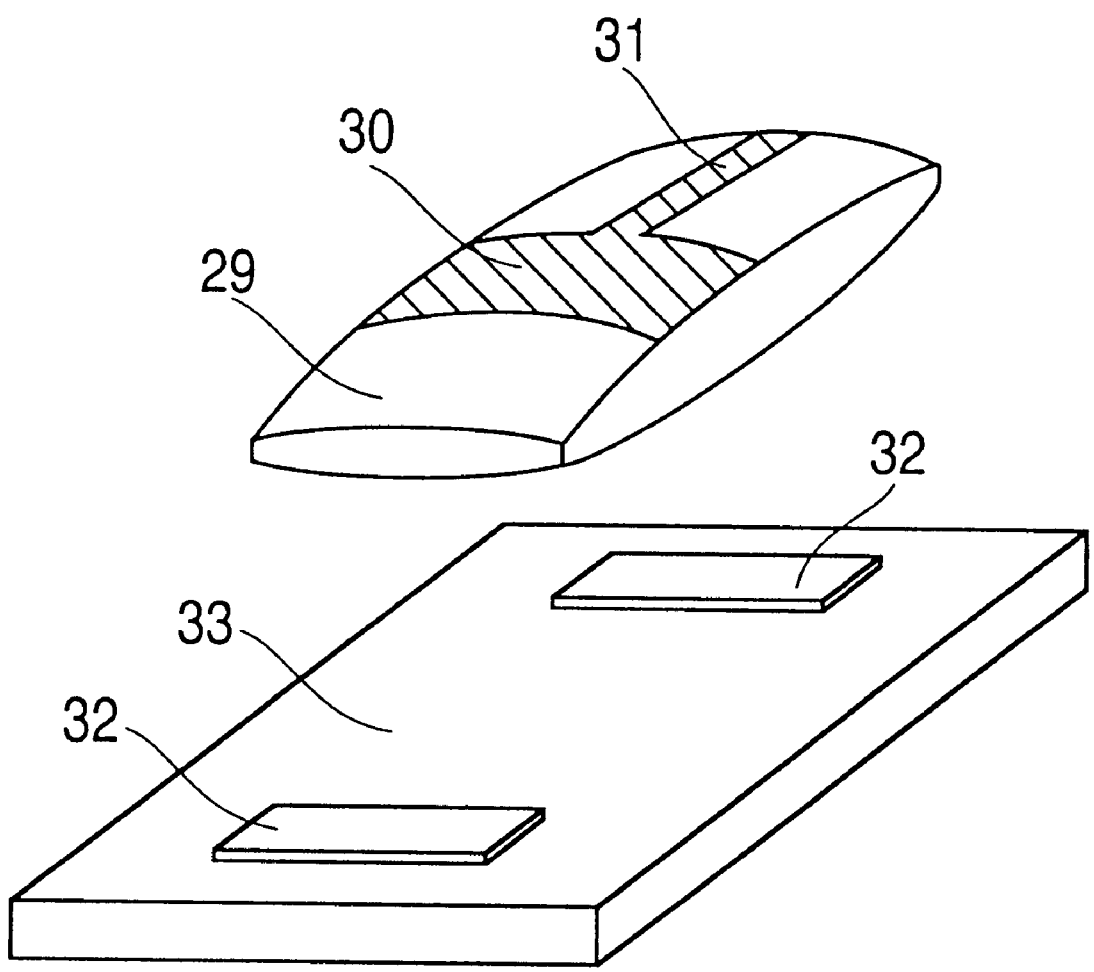
FIG. 14 is a disassembled perspective view of a conventional vibrator.

FIG. 12 and FIG. 13 illustrate a piezoelectric vibrator which uses thickness-sliding vibration of lithium tantalate X-plate as the primary vibration, where numeral 24 is a vibrator in which convex configuration is approximated with a 4-step stepwise configuration, numeral 25 is a support section integrated with the vibrator 24, numeral 26 is a vibration-excitation electrode opposingly provided on each of the front and rear sides of the vibrator 24, numeral 27 is an electrode for external connection, and numeral 28 is a lead for connection with the external connection electrode.

Similar to what has been described in Example 1, as the vibration-excitation electrode 26 is locally formed on the vibrator section, the vibration energy can be confined to underneath the vibration-excitation electrode. Further, as a convex configuration of the vibrator section 24 is approximated by a stepwise configuration, the vibration displacement is at a maximum at the central portion of the vibrator section and attenuates as one goes closer to the end portions of the vibrator section. In addition, the end portions of the vibrator section are integrated with the support section resulting in less possibility of dispersion of precision of working including chipping and surface roughness at the end portions of the vibrator section.

As a result, a vibrator with a small dispersion of characteristic can be obtained. Also, though the thicknesses of the end portions of the vibrator section are smaller than that of the central portion of the vibrator section as a convex configuration is approximated with a stepwise configuration, there occurs no chipping or cracking at the end portions of the vibrator section as they are integrated with the support section thus providing a superior mechanical strength and easy mounting.

As has been described above, as a vibrator of which the thicknesses of the end portions are smaller than that of the central portion such as by making the cross section of the vibrator bevel or convex in configuration is integrated with a support section, the present invention provides a vibrator with a superior mechanical strength free of chipping or cracking at the end portions of the vibrator and makes steady mounting easy. As there is no exposed portion such as a slit at the end portions of the vibrator section, an additional benefit is obtained in which the dispersion of characteristic attributable to the precision of working is small.

While a description has been given in the foregoing by way of example vibrators primarily using piezoelectric single crystal, needless to say the vibrators may be one using other piezoelectric materials such as piezoelectric ceramic.

What is claim is:

1. A piezoelectric vibrator comprising:
a vibrator portion having peripheral ends and having a generally convex cross-sectional shape approximated by a stepwise configuration including a plurality of steps, wherein each of said steps has one of an inclined planar contour and a curved contour; and
a support portion formed of a same material as said vibrator portion, said peripheral ends of said vibrator portion being integrated with said support portion.

2. The piezoelectric vibrator of claim 1, further comprising a vibration-excitation electrode on said vibrator portion.

3. The piezoelectric vibrator of claim 2, wherein a ratio We/W of a width We of said vibration-excitation electrode to a width W of said vibrator portion is in a range of 0.2 to 1.

4. The piezoelectric vibrator of claim 2, further comprising a second electrode on said support portion and a lead extending from said vibration-excitation electrode to said second electrode, wherein said lead is formed on one of an inclined planar surface and a curved surface.

5. A piezoelectric vibrator comprising:
a vibrator portion having a central portion, peripheral ends, and a generally convex cross-sectional shape approximated by a stepwise configuration including a plurality of steps, wherein a quantity of said steps from said central portion of said vibrator portion to said peripheral ends of said vibrator portion is in a range of 2 to 10 steps; and
a support portion formed of a same material as said vibrator portion, said peripheral ends of said vibrator portion being integrated with said support portion.

6. The piezoelectric vibrator of claim 5, further comprising a vibration-excitation electrode on said vibrator portion.

7. The piezoelectric vibrator of claim 6, wherein a ratio We/W of a width We of said vibration-excitation electrode to a width W of said vibrator portion is in a range of 0.2 to 1.

8. The piezoelectric vibrator of claim 6, further comprising a second electrode on said support portion and a lead extending from said vibration-excitation electrode to said second electrode, wherein said lead is formed on one of an inclined planar surface and a curved surface.

9. A piezoelectric vibrator comprising:
a vibrator portion having peripheral ends and having a generally convex cross-sectional shape approximated by a stepwise configuration including a plurality of steps; and
a support portion formed of a same material as said vibrator portion, said peripheral ends of said vibrator portion being integrated with said support portion.

10. The piezoelectric vibrator of claim 9, further comprising a vibration-excitation electrode on said vibrator portion.

11. The piezoelectric vibrator of claim 10, wherein a ratio We/W of a width We of said vibration-excitation electrode to a width W of said vibrator portion is in a range of 0.2 to 1.

12. The piezoelectric vibrator of claim 10, further comprising a second electrode on said support portion and a lead extending from said vibration-excitation electrode to said second electrode, wherein said lead is formed on one of an inclined planar surface and a curved surface.

* * * * *